United States Patent
Fishkin

(10) Patent No.: US 7,782,052 B2
(45) Date of Patent: Aug. 24, 2010

(54) METHOD TO DETERMINE THE MEASUREMENT WORKFLOW OF A MAGNETIC RESONANCE TOMOGRAPHY APPARATUS IN THE GENERATION OF SLICE IMAGES OF A SUBJECT

(75) Inventor: Alexey Fishkin, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 101 days.

(21) Appl. No.: 12/112,115

(22) Filed: Apr. 30, 2008

(65) Prior Publication Data

US 2008/0284431 A1 Nov. 20, 2008

(30) Foreign Application Priority Data

May 15, 2007 (DE) .................. 10 2007 022 706

(51) Int. Cl.
*G01V 3/00* (2006.01)
(52) U.S. Cl. .................. 324/307; 324/309; 324/318
(58) Field of Classification Search ......... 324/300–322; 600/410, 411
See application file for complete search history.

(56) References Cited

U.S. PATENT DOCUMENTS

| | | | |
|---|---|---|---|
| 6,249,120 B1 | 6/2001 | McKinnon et al. | |
| 6,850,793 B1 | 2/2005 | Miyazaki et al. | |
| 7,312,610 B2 * | 12/2007 | Harder | 324/307 |
| 2002/0087066 A1 | 7/2002 | Hellinger | |
| 2002/0173715 A1 * | 11/2002 | Kruger et al. | 600/410 |
| 2005/0264286 A1 * | 12/2005 | Harder | 324/307 |
| 2007/0255128 A1 * | 11/2007 | Nistler | 600/410 |
| 2008/0284431 A1 * | 11/2008 | Fishkin | 324/307 |

FOREIGN PATENT DOCUMENTS

| | | |
|---|---|---|
| JP | 2005144075 | 6/2005 |
| WO | WO 2007/121020 | 10/2007 |

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

In a method for determination of the measurement workflow of a magnetic resonance tomography apparatus in the generation of slice images of a subject, a number of slice images to be generated is established. A total number of measurement regions is established for each of the slice images, with one measurement being necessary for the acquisition of the data of each of the measurement regions. An individual measurement sequence is determined for each slice image, comprising an excitation and a determined number of successive measurements of different measurement regions of the appertaining slice image, with a number of measurement sequences being necessary for acquisition of all measurement regions of the appertaining slice image. The individual measurement sequences are to be distributed to a determined number of measurement streams is determined. An order is established as to the distribution of the entirety of measurements of a respective slice image among the measurement streams.

12 Claims, 2 Drawing Sheets

FIG 1
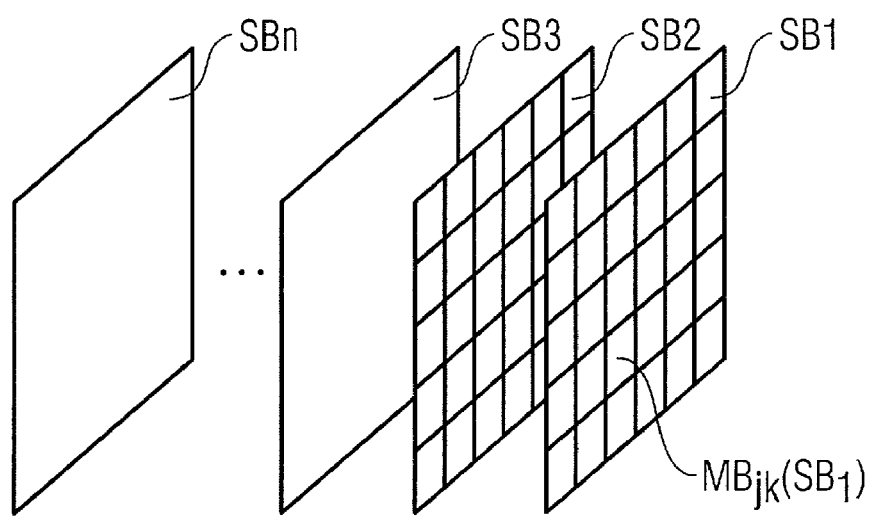
FIG 3
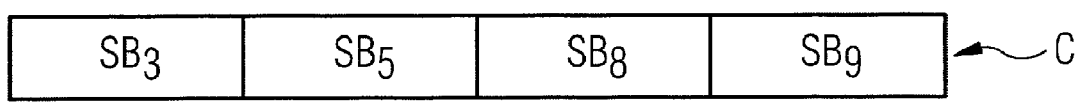

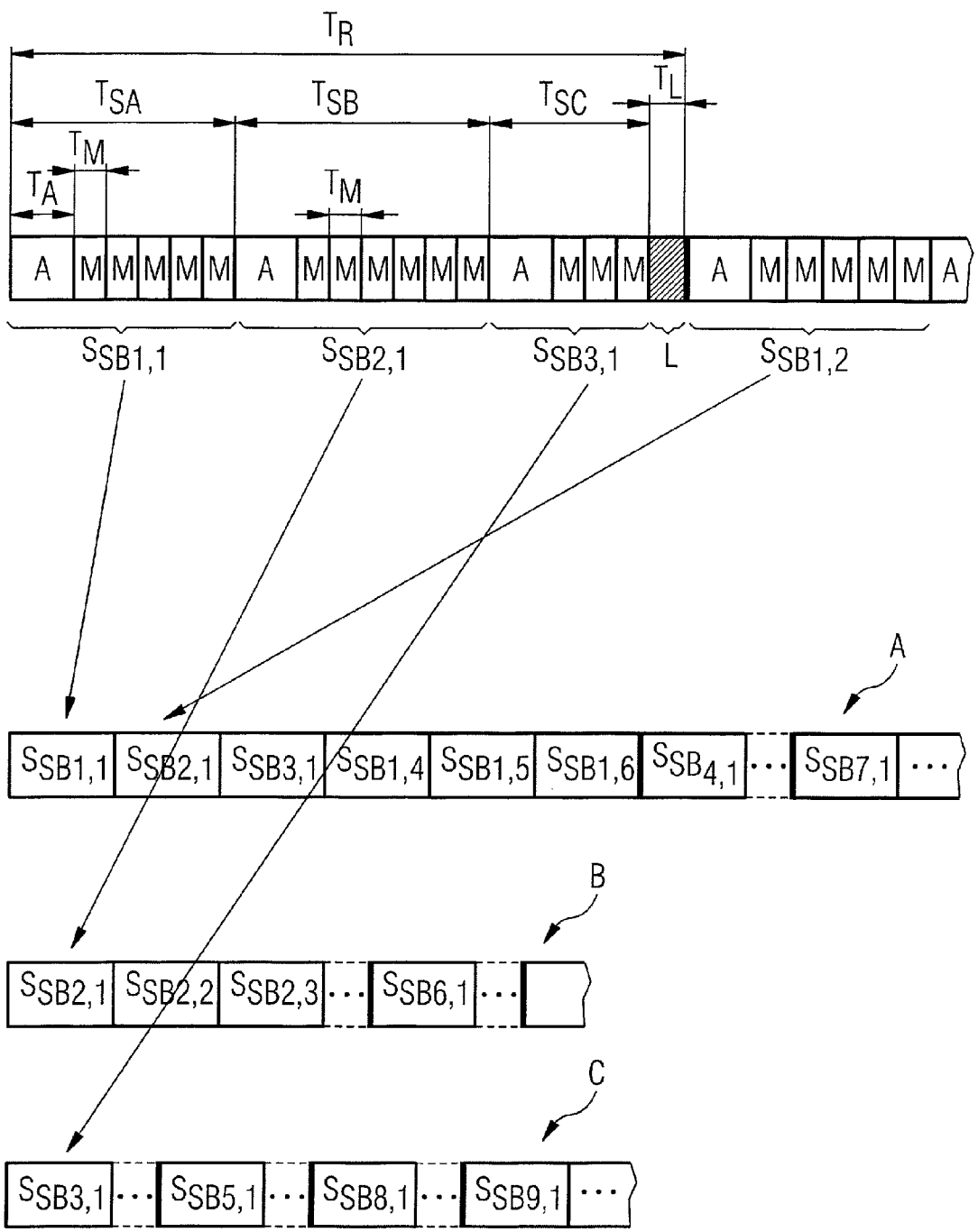

METHOD TO DETERMINE THE MEASUREMENT WORKFLOW OF A MAGNETIC RESONANCE TOMOGRAPHY APPARATUS IN THE GENERATION OF SLICE IMAGES OF A SUBJECT

BACKGROUND OF THE INVENTION

1. Field of the Invention

The present invention concerns a method to determine the measurement (data acquisition) workflow of a magnetic resonance tomography apparatus in the generation of slice images of a subject. The invention furthermore concerns a device for controlling a magnetic resonance tomography apparatus.

2. Description of the Prior Art

Magnetic resonance tomography (also called magnetic resonance imaging, MRI) is an imaging method for depiction of structures inside subjects, essentially inside bodies. Slice images of the subject to be examined (the human or animal body) can be generated with magnetic resonance tomography, which slice images permit a comparison and an orientation of anatomical slices of the same region and allow an assessment of the organs and many organ variations. Magnetic resonance tomography uses magnetic fields and radio-frequency electromagnetic waves. The basis for the image contrast is the different sensitivity (susceptibility) of the examined tissue to the applied physical variables.

Nuclear magnetic resonance forms the physical basis of magnetic resonance tomography. Protons as well as neutrons have an inherent angular momentum (spin), and charged particles thereby receive a magnetic moment in a magnetic field. If a rotating atomic nucleus is brought into a static magnetic field, it is aligned according to the field. The rotation axis of the nucleus rotates in the direction of the applied magnetic field. A precessional movement occurs any time when the nucleus is brought out of its rest position. If the external field is removed, the nucleus falls back into its original position. If a second field (what is known as a transverse field) is applied which is perpendicular to the static field, the nucleus begins to precess again until an equilibrium state arises. This is likewise the case when the field is switched off again. In order to intentionally excite nuclei is an examination to precession, this second field is an alternating radio-frequency field and rotates in an x-y plane.

A resonant frequency exists for the precession movement of the nuclear spin. For atomic nuclei, this eigenfrequency is called the Larmor frequency. It depends on the strength of the applied magnetic field and on the structure of the nucleus. Which nuclei are resonated can be very precisely determined by the selection of the strength of the first static field and the selection of the frequency of the transversal field. The macroscopic magnetic moment of the nucleus is tilted by 90° in to the x-y plane due to the resonance effect and rotates precessing with the transversal field.

If the transverse alternating field which has tilted the magnetic moment of a nucleus by 90° is deactivated, the nucleus rotates further in the x-y plane. If a coil is brought into proximity to the rotating magnetic moment, a voltage is induced in this call. Typically the measurement coils normally are in the x-y plane, and the measured voltage is proportional to the transversal magnetization of the magnetic moment of the atomic nucleus. A rotating transverse magnetization arising from the transverse magnetizations of the individual nuclei can be generated with a series of radio-frequency pulses of the transverse field in a subject that lies in a strong magnetic field. This transverse magnetization is dependent on the location and on the tissue type of the subject to be examined.

The goal of magnetic resonance tomography is the generation of slice images of the transverse magnetization. The use of magnetic resonance tomography apparatuses is associated with high costs for purchasing and maintenance. The development of new magnetic resonance tomography apparatuses therefore seeks to reduce the operating costs in addition to the improvement of technical aspects. One of the possible solutions is to improve the time efficiency of magnetic resonance tomography. This means that it is sought to reduce the time for generation of the slice images of a subject.

For this purpose, methods known as turbo spin echo sequences (TurboSE) have been developed that achieves an acceleration of the measurement workflow by the optimization of the known spin echo and gradient echo techniques. An acquisition matrix thus can be generated with higher speed, but contrast losses in the slice image generation must be accepted. The acquisition matrix represents a total number of measurement regions that are necessary for generation of a slice image. A method called a "turbo inversion time recovery sequences (TurboIRTSE)" is also known that represents a development of TurboSE. This exhibits the advantage that it can generate a much stronger contrast in the slice images and suppresses tissue (such as liquid or fat) in the depiction. A disadvantage of TurboIRTSE is that an additional inversion radio frequency (IRF) pulse is required which makes the method less time-efficient.

SUMMARY OF THE INVENTION

An object of the present invention is to provide a method with which the total time for the generation of a predetermined number of slice images of a subject to be examined can be reduced or optimized. It is also an object of the present invention to specify a device with which this goal can be achieved.

The inventive method for determination of the measurement workflow of a magnetic resonance tomography apparatus in the generation of slice images of a subject (in particular of an animal or human tissue) includes the following steps. A number of slice images to be generated, in particular slice images running quasi-parallel, is established. An (in particular identical) total number of measurement regions is established for each of the slice images, wherein one measurement is necessary for the acquisition of the data of each of the measurement regions. An individual measurement sequence is determined for each slice image. Each measurement sequence comprises an excitation and a determined number of successive measurements of different measurement regions of the appertaining slice image. Multiple measurement sequences are necessary for acquisition of all measurement regions of the appertaining slice image. Furthermore, it is determined in which manner the individual measurement sequences are to be distributed to a determined number of measurement streams. An order (sequence) is established as to the distribution of the entirety of measurements of a respective slice image among the measurement streams.

The time duration for the generation of slice images of a subject can be significantly shortened with the inventive method. Furthermore, the time necessary or the generation of the measurement plan before the actual measurements is reduced relative to known methods. The time reduction in the measurement results from the fact that a number of measurement streams is determined and the speed of the measurement streams is determined, meaning that the number of individual measurements per measurement stream is determined. The number of measurement sequences per measurement stream is also determined. The times in which the magnetic resonance tomography apparatus implements no measurements due to given boundary conditions can thereby be minimized or even reduced to zero.

In an embodiment, a relaxation time of the subject to be examined is taken into account in the inventive method. It is also appropriate when a time duration of a single measurement and a time duration of the excitation are taken into account.

In a further embodiment of the method, each measurement sequence includes a number of measurements that lie between a predetermined lower number and a predetermined upper number of measurements. The time duration until the determination of an optimized measurement workflow thus can be reduced.

According to a further embodiment, measurement sequences of different slice images are arranged within the given relaxation time. This allows the more or less substantially parallel generation of acquisition matrices of a plurality of slice images. Measurement sequences are appropriately arranged within the given relaxation time and selected with a respective number of measurements such that a time duration in which no measurement ensues is minimal.

In a further embodiment, the measurements of a slice image are associated with the original determined measurement stream. The measurement sequences of a slice image are also appropriately arranged in succession in the specific measurement stream. The expenditure to generate the acquisition matrix of the appertaining slice image can be minimized via these measures.

The measurements of the slice images can be associated with the measurements such that the association with all measurement streams ends within a predetermined time span. This means that the time duration in which only one of the measurement streams is filled with data is minimal. Expressed differently, this means that the association of measurement sequences with the different measurement streams is ended at approximately the same point in time.

The term "measurement stream" is known in this field as a "stream". A number of measurement streams are required in order to enable the successive arrangement of measurement sequences of a slice image. However, since measurement sequences for different slice images are detected within a given relaxation time in an optimized measurement workflow, for time reasons it is appropriate to effectively process the data to be measured herein for the respective different slice images in parallel in different measurement streams. The number of measurement streams therewith depends on the number of different measured slice images within a given relaxation time.

The inventive method can be implemented for magnetic resonance tomography apparatuses that are fashioned for implementing pulse sequence known as turbo sequences. The number of the measurement streams is at least as large as the number of the different measured slice images within the relaxation time.

An inventive device for controlling a magnetic resonance tomography apparatus is fashioned for implementation of the method described above. The pre-processing for determination of the measurement workflow of the magnetic resonance tomography apparatus can optionally be implemented in a device which is independent of the control device of the magnetic resonance tomography apparatus. In this case the result of the determined workflow must be provided to this apparatus control device.

The invention also encompasses a computer program product (computer-readable medium) that can be loaded directly into the internal memory of a digital computer is encoded with programming instructions with which the steps according to the method described above can be executed when the product runs on a computer.

BRIEF DESCRIPTION OF THE DRAWINGS

FIG. 1 is a schematic representation of the slice images of a subject that are to be generated by a magnetic resonance tomography apparatus.

FIG. 2 is a schematic representation of the method implemented in the framework of the invention.

FIG. 3 is a schematic representation of the association of measurements of a respective slice image with a defined number of measurement streams, which association is effected in the framework of the invention.

DESCRIPTION OF THE PREFERRED EMBODIMENTS

Slice images are generated in magnetic resonance tomography to depict structures inside a subject to be examined, for example human or animal tissue. These are designated with $SB_1, SB_2, SB_3, \ldots, SB_n$ (in general $SB_i$, wherein i=1 through n) in the schematic presentation. The number i of the slice images $SB_i$ to be generated in the magnetic resonance tomography depends on a desired spatial resolution and the size of the subject to be examined. The slice images $SB_i$ advantageously are substantially parallel to one another, but this is not mandatory.

A total number of measurement regions $MB_{jk}$ is established for each of the slice images $SB_i$. As shown for image $SB_1$, the area of the slice image is divided into a number of measurement regions that advantageously exhibit the same size. These proceed in rows and columns. The index j (j=1 through y) stands for the number of rows, the index k (k=1 through z) for the number of columns. The total number y·z of the measurement regions $MB_{jk}$ can in principle be arbitrarily selected and essentially depends on a desired resolution. If the number of the measurement regions is established for one of the slice images (for example $SB_1$), it is thus advantageous when each of the other slice images $SB_2, \ldots, SB_n$ exhibits the identical number of measurement regions. In the exemplary embodiment of FIG. 1 the slice images $SB_i$ exemplarily, respectively exhibit 5×6 measurement regions $MB_{jk}$.

An entry into what is known as an acquisition matrix which comprises j rows and k columns (corresponding to the number of the measurement regions $MB_{jk}$) is generated with the measurement technology acquisition of the data of a measurement region $MB_{jk}$ of a slice image $SB_i$. With the method described below, it is possible to fill a respective acquisition matrix associated with one of the slice images $SB_i$ in an optimized time.

An excitation of the atomic nuclei ensues in the plane defined by the slice image for acquisition of the data of a slice image $SB_i$ via measurement technology. An excitation pulse (or excitation pulse sequence) is identified with A in FIG. 2. A separate measurement M ensues for each of the measurement regions $MB_{jk}$, wherein the time duration $T_M$ is required for each measurement. The entirety of the excitation pulse A and the number of measurements M is designated as a measurement sequence $S_{SBi,m}$. The index I in $SB_i$ designates the number of the slice image $SB_i$. The index m represents a numerical value for the m-th measurement sequence, wherein the number of the necessary measurement sequences results from the number of individual measurements and the total number of measurement regions $MB_{jk}$.

For example, five measurements M should be implemented for the acquisition of the slice image $SB_1$ via measurement technology. The entire time for measurement acquisition and excitation of five measurement regions MB of the slice image is $T_{S4}$. This includes $T_A$ and $T_M$ five times. A relaxation time $T_R$ must be waited until the slice image $SB_1$ may be excited again. The relaxation time $T_R$ hereby extends between the beginning of two excitation pulses A that are associated with the same slice image $S_1$. In practice, a sufficiently long time span is achieved in which an excitation of one or more further slice images ($SB_2$ and $SB_3$ in the exemplary embodiment) can be effected after the end of the time span $T_{S4}$, until reaching the end of $T_R$. It is thereby achieved that a time $T_L$ is optimally minimized in which no measurements are implemented by the magnetic resonance tomography apparatus. In the exemplary embodiment the number of the measurements M to be implemented in succession in a measurement sequence $S_{SB2,1}$ of the slice image $SB_2$ was established at 6. The number of the measurements in a measurement sequence $M_{SB3,1}$ for the third slice image $SB_3$ was established at 3. The time $T_{SB}$ is required for implementation of the measurement sequence $S_{SB2,1}$. The time $T_{SC}$ is required for implementation of the measurement sequence $S_{SB3,1}$.

The number of respective measurements M in a measurement sequence for the slice image $SB_1$, $SB_2$, $SB_3$ is selected in the framework of an optimization process such that the time duration $T_L$ is optimally small or even zero. It is permissive even desired that the number of respective measurements M of different slice images $SB_1$, $SB_2$, $SB_3$ within the relaxation time $T_R$ are different. This has the result that in total six measurement sequences are necessary in the selected exemplary embodiment for acquisition of the slice image $SB_1$ with measurement technology. This results from the total number of 30 measurement regions and a number (selected once in the exemplary embodiment) of five measurements per measurement sequence (that is also retained in further measurements). Overall five measurement sequences are necessary for acquisition of the slice image $SB_2$. Since a measurement sequence for the slice image $SB_3$ comprises only three measurements M, overall ten measurement sequences are necessary for this.

As already explained, a new measurement sequence for the slice image $SB_1$ is implemented after the expiration of the relaxation time $T_R$. Measurement sequences for the slice images $SB_2$ and $SB_3$ are likewise implemented in a corresponding manner until a respective acquisition matrix of an appertaining slice image $SB_i$ is completely generated. In this case it is sought to implement a measurement sequence of a slice image that has not yet been acquired via measurement technology.

As explained above, an individual measurement sequence is determined for each slice image in the framework of the method, wherein a plurality of measurement sequences is necessary for acquisition of all measurement regions of the appertaining slice image. The respective measurement sequences are also associated with measurement streams (streams). The association thereby ensues such that measurement sequences belonging to a specific slice image $SB_i$ are in principle associated with the same measurement stream and a successive arrangement also ensues.

Overall, three measurement streams A, B, C have been determined as an optimal number of measurement streams in the exemplary embodiment according to FIG. 2. The measurement sequence $S_{SB1,1}$ is associated with the first measurement stream A. The measurement sequence $S_{SB2,1}$ is associated with the second measurement stream B. The measurement sequence $S_{SB3,1}$ is associated with the third measurement stream C. In general the number of the measurement streams A, B, C does not have to be the same as the number of the measurement sequences $S_{SBi,m}$ implemented within a relaxation time $T_R$.

The allocation of the measurement sequences or the slice images ensues such that the substantially parallel generation of the measurement streams A, B, C comes to an end simultaneously for all slice images $SB_i$ acquired by means of measurement technology. This is more apparent from FIG. 3, which shows the measurement streams A, B, C filled with data in a more coarse resolution in comparison to FIG. 2. As is apparent from FIG. 3, the measurement streams A, B, C are not periodically filled with the data of respective slice images, but the filling of the measurement streams A, B, C is ended approximately simultaneously. In the exemplary embodiment the data of the slice images $SB_1$, $SB_4$, $SB_7$ are associated with the measurement stream A. The measurement data of the slice images $SB_3$, $SB_5$, $SB_8$ and $SB_9$ are associated with the measurement stream C. By contrast, only the measurement data of the slice images $SB_2$ and $SB_6$ are associated with the measurement stream B. Identically long slice images are advantageously respectively associated with each measurement current.

The optimization of the method for determination of the measurement workflow of magnetic resonance tomography in the generation of slice images thus is accomplished by minimizing the times $T_L$ during a measurement and also simultaneously ensuring that an optimally simultaneous end occurs given a substantially parallel population of measurement streams. This is effected via a computer-controlled optimization wherein three parameters are specified: the number of the measurement streams, the speed of each measurement stream (i.e. the number of the measurements to be placed on one measurement stream) and the number of the measurement sequences of slice images on each measurement stream. The simultaneous optimization of these three parameters allows an optimal filling the acquisition matrix. The total time for the generation of a predetermined number of slice images of an examined subject can hereby be reduced or, respectively, optimized. The inventive method thus exhibits the advantage that the determination of an optimal number of measurement streams as well as the determination of an optimal number of measurements for respective measurement sequences comes to an end in a short time. The calculation of an optimal acquisition scheme can be effected in a time between 10 and 40 ms. A corresponding algorithm for calculation of the given variables can be generated in a simple manner.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for determining a measurement workflow of a magnetic resonance tomography apparatus in the generation of slice images of a subject, comprising the steps of:

establishing a number of slice images to be generated;

establishing a total number of measurement regions for each of the slice images, with one measurement being necessary for acquisition of data for each of said measurement regions;

in a processor supplied with said number of slice images and said number of measurement regions, automatically determining a measurement sequence for each of said slice images, each measurement sequence comprising an excitation and a predetermined number of successive data acquisitions from different ones of said measurement regions of that slice image, with a plurality of measurement sequences being necessary for acquiring said data for all measurement regions of that slice image, said data acquired for all measurement regions of each slice image collectively forming a slice image data set for that slice;

in said processor, processing all of the slice image data sets in a predetermined number of data streams;

in said processor, automatically determining a distribution of the slice image data sets respectively assigned to said predetermined number of data streams and in said processor, automatically establishing an order in which all of the respective data acquisitions for each slice image will occur, which is dependent on said distribution of said image data sets in said predetermined number of data streams, that minimizes a total time of acquiring said data for all of said measurement regions of all of said slice, and emitting a control signal from an output of the processor in a form that controls the magnetic resonance tomography apparatus which then implements said data acquisitions in said order.

2. A method as claimed in claim 1 wherein said subject exhibits a relaxation time, and determining said distribution and said order dependent on said relaxation time.

3. A method as claimed in claim 1 wherein each measurement sequence has a measurement time duration and each excitation has an excitation time duration, and determining said distribution and said order dependent on said measurement time duration and said excitation time duration.

4. A method as claimed in claim 1 wherein each measurement sequence comprises a plurality of measurements in a range between a predetermined minimum number of measurements and a predetermined maximum number of measurements.

5. A method as claimed in claim 1 wherein said subject exhibits a relaxation time, and conducting measurement sequences for different ones of said slice images within a single relaxation time.

6. A method as claimed in claim 5 comprising arranging said measurement sequences in said single relaxation time by minimizing a total time within said relaxation time in which no measurement sequence occurs.

7. A method as claimed in claim 1 comprising associating data acquisition of a respective slice image with an originally determined measurement stream.

8. A method as claimed in claim 7 comprising arranging said measurement sequence of a respective slice image successively within said original determined measurement stream.

9. A method as claimed in claim 1 comprising associating data acquisitions of said slice images with the respective measurement streams by causing all of said measurement streams to end within a predetermined time span.

10. A method as claimed in claim 1 comprising employing turbo sequences for magnetic resonance tomography as said measurement sequences.

11. A device configured for determining a measurement workflow of a magnetic resonance tomography apparatus in the generation of slice images of a subject, comprising:

an information source from which a number of slice images to be generated is established from which a total number of measurement regions of each of the slice images is established, with one measurement being necessary in acquiring data of each of said measurement regions; and a processor in communication with said information source that is configured to automatically determine a measurement sequence of each of said slice images, each measurement sequence comprising an excitation; and a predetermined number of successive data acquisitions from different ones of said measurement regions of a respective slice image, with a plurality of measurement sequences being necessary in acquiring said data of all measurement regions of that respective slice image, said data acquired in all measurement regions of that slice image collectively forming a slice image data set of that respective slice;

said processor processing all of the slice image data sets in a predetermined number of data streams; and automatically determining a distribution of the slice image data sets respectively assigned to said predetermined number of data streams and then automatically establishing an order in which all of the respective data acquisitions of each slice image will occur, dependent on said distribution of said image data sets in said predetermined number of data streams, that minimizes a total time of acquiring said data in all of said measurement regions of all of said respective slices, and emitting a control signal from an output of the processor in a form that controls the magnetic resonance tomography apparatus which then implements said data acquisitions in said order.

12. A computer-readable medium encoded with programming instructions configured for determining a measurement workflow of a magnetic resonance tomography apparatus in the generation of slice images of a subject, for which a number of slice images to be generated is established and for which a total number of measurement regions of each of the slice images is established, with one measurement being necessary in acquiring data of each of said measurement regions, said medium being loadable into a computer that controls operation of said apparatus and said programming instructions causing said control computer to:

automatically determine a measurement sequence of each of said slice images, each measurement sequence comprising;

an excitation and a predetermined number of successive data acquisitions from different ones of said measurement regions of a respective slice image, with a plurality of measurement sequences being necessary in acquiring said data of all measurement regions of that respective slice image, said data acquired in all measurement regions of each slice image collectively forming a slice image data set of that slice;

process all of the slice image data sets in a predetermined number of data streams;

automatically determine a distribution of slice image data sets respectively assigned to said predetermined number of data streams;

automatically establish an order in which all of the respective data acquisitions of each slice image will occur, dependent on said distribution of said image data sets in said predetermined number of data streams, that minimizes a total time of acquiring said data in all of said measurement regions of all of said slice, and emit a control signal from an output of the control computer in a form that controls the magnetic resonance tomography apparatus which then implements said data acquisitions in said order.

* * * * *